US006359620B1

(12) United States Patent
Fujita

(10) Patent No.: US 6,359,620 B1
(45) Date of Patent: Mar. 19, 2002

(54) DISPLAY CONTROLLING DEVICE, DISPLAY CONTROLLING METHOD AND MEMORY MEDIUM FOR STORING DISPLAY CONTROL PROGRAM

(75) Inventor: Tatsuyuki Fujita, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/394,668

(22) Filed: Sep. 14, 1999

(30) Foreign Application Priority Data

Sep. 17, 1998 (JP) ............................................. 10-263592

(51) Int. Cl.[7] .............................. G09G 5/08; G06T 11/20
(52) U.S. Cl. ...................... 345/440.1; 345/208; 345/767; 345/802
(58) Field of Search ................................ 345/121, 134, 345/24, 157, 440.1, 208, 214, 94, 784, 785, 786, 788, 798, 802, 767

(56) References Cited

U.S. PATENT DOCUMENTS

| 4,586,036 A | * | 4/1986 | Thomason et al. | ............ 345/24 |
| 5,039,937 A | * | 8/1991 | Mandt et al. | ............ 324/121 R |
| 5,129,722 A | * | 7/1992 | Mader et al. | ............... 356/73.1 |

* cited by examiner

*Primary Examiner*—Michael Razavi
*Assistant Examiner*—Thu-Thao Havan
(74) *Attorney, Agent, or Firm*—Oliff & Berridge, PLC

(57) ABSTRACT

A display controlling device comprises; a display for displaying a data to be displayed in a display field, an input part for scrolling the display field, and a display field shift control unit for shifting the display field in one direction so that when the display field is scrolled in another direction to display the data to be displayed, the whole data to be displayed is displayed in the display field.

27 Claims, 6 Drawing Sheets

DISPLAY CONTROLLING DEVICE, DISPLAY CONTROLLING METHOD AND MEMORY MEDIUM FOR STORING DISPLAY CONTROL PROGRAM

BACKGROUND OF THE INVENTION

1. Field of the Invention

The present invention relates to a display controlling device, a display controlling method and a memory medium for storing a display control program, for controlling a display position of a waveform signal displayed on a screen of a display device according to a cursor position indicated by an input part.

2. Description of the Related Art

According to an earlier development, when a measured waveform which is measured by a measuring device for measuring a signal waveform is displayed on a screen of a display device, the following display operations are carried out. The detail of the measured waveform is enlarged to display it on the screen in order to examine a situation of the waveform, for example, a variation thereof, in detail. The measured waveform is reduced to display it on the screen in order to examine a situation of a whole measured waveform roughly.

According to the above-described display operations for examining a measured waveform, in particular, when the detail of the measured waveform is enlarged to display it in order to examine a specific part of the measured waveform, the specific part of the measured waveform is moved out of the display field of the screen by magnifying the measured waveform to vary the display scale. It is necessary that the cursor position or the like, which is displayed in the display field is adjusted by manual operations in order to move the specific part of the measured waveform into the display field.

According to the earlier display operations for examining a measured waveform, in particular, when the detail of the measured waveform is enlarged to display it in order to examine the specific part of the measured waveform, it is necessary that the cursor position or the like, which is displayed in the display field is adjusted by manual operations in order to move the specific part of the measured waveform into the display field. There is a problem that it is difficult to carry out the operations for enlarging the measured waveform to display it.

SUMMARY OF THE INVENTION

In order to solve the above-described problems, an object of the present invention is to provide a display controlling device, a display controlling method and a memory medium for storing a display control program, for automatically shifting a measured waveform to a proper display position in the display field when the measured waveform is enlarged to display it.

That is, in accordance with one aspect of the present invention, the display controlling device for controlling a display position of a waveform signal displayed on a screen of a display device according to a cursor position indicated by an input part, comprises;

a judging circuit for judging whether the cursor position indicated by the input part is in the screen or out of the screen, and a display control circuit for shifting a display field for the waveform signal displayed on the screen according to the cursor position indicated by the input part when the judging circuit judges that the indicated cursor position is out of the screen.

According to the present invention, because the display field for the waveform signal is automatically adjusted according to the indicated cursor position, it is possible to easily carry out the operations for scrolling the display field by moving the cursor in the screen on which the waveform signal is displayed.

The display control circuit may adjust an amount of shift of the display field for the waveform signal according to a shape of the waveform signal when the display field is shifted.

Because the amount of shift of the display field is automatically adjusted according to the shape of the waveform signal, it is possible to easily carry out the operations, for example, the operations for examining the detail of the enlarged waveform signal to be displayed by moving the cursor.

In accordance with another aspect of the present invention, the display controlling method, for controlling a display position of a waveform signal displayed on a screen of a display device according to a cursor position indicated by an input part, comprises the steps of;

judging whether the cursor position indicated by the input part is in the screen or out of the screen, and shifting a display field for the waveform signal displayed on the screen according to the cursor position indicated by the input part when it is judged that the indicated cursor position is out of the screen.

According to the present invention, because the display field for the waveform signal is automatically adjusted according to the indicated cursor position, it is possible to easily carry out the operations for scrolling the display field by moving the cursor in the screen on which the waveform signal is displayed.

The shifting step may be carried out by adjusting an amount of shift of the display field for the waveform signal according to a shape of the waveform signal.

Because the amount of shift of the display field is automatically adjusted according to the shape of the waveform signal, it is possible to easily carry out the operations, for example, the operations for examining the detail of the enlarged waveform signal to be displayed by moving the cursor.

In accordance with another aspect of the present invention, the memory medium for storing a display control program for controlling a display position of a waveform signal displayed on a screen of a display device according to a cursor position indicated by an input part, wherein the display control program comprises;

a program code for judging whether the cursor position indicated by the input part is in the screen or out of the screen, and a program code for shifting a display field for the waveform signal displayed on the screen according to the cursor position indicated by the input part when it is judged that the indicated cursor position is out of the screen.

According to the present invention, because the display field for the waveform signal is automatically adjusted according to the indicated cursor position, it is possible to easily carry out the operations for scrolling the display field by moving the cursor in the screen on which the waveform signal is displayed.

The program code for shifting the display field for the waveform signal may comprise a program code for adjusting an amount of shift of the display field for the waveform signal according to a shape of the waveform signal.

Because the amount of shift of the display field is automatically adjusted according to the shape of the waveform signal, it is possible to easily carry out the operations, for example, the operations for examining the detail of the enlarged waveform signal to be displayed by moving the cursor.

In accordance with another aspect of the present invention, the display controlling device comprises;

a display for displaying a data to be displayed in a display field, an input part for scrolling the display field, and a display field shift control unit for shifting the display field in one direction so that when the display field is scrolled in another direction to display the data to be displayed, the whole data to be displayed is displayed in the display field.

The data may be a waveform of a signal.

In accordance with another aspect of the present invention, the display controlling method comprises the steps of;

displaying a data to be displayed in a display field, scrolling the display field, and shifting the display field in one direction so that when the display field is scrolled in another direction to display the data to be displayed, the whole data to be displayed is displayed in the display field.

The shift step may be carried out by executing a first shift of the display field in a vertical direction so that a center of the data to be displayed is positioned approximately in a middle between an upper end of the display field and a lower end thereof, and by further executing a second shift of the display field in the vertical direction when the whole data to be displayed is not displayed in the display field although the first shift was executed.

The shift step may be carried out by executing a first shift of the display field in a horizontal direction so that a center of the data to be displayed is positioned approximately in a middle between a right end of the display field and a left end thereof, and by further executing a second shift of the display field in the horizontal direction when the whole data to be displayed is not displayed in the display field although the first shift was executed.

The data may be a waveform of a signal.

In accordance with another aspect of the present invention, the memory medium for storing a display control program, wherein the display control program comprises;

a program code for displaying a data to be displayed in a display field, a program code for scrolling the display field, and a program code for shifting the display field in one direction so that when the display field is scrolled in another direction to display the data to be displayed, the whole data to be displayed is displayed in the display field.

The program code for shifting the display field may comprise a program code for executing a first shift of the display field in a vertical direction so that a center of the data to be displayed is positioned approximately in a middle between an upper end of the display field and a lower end thereof, and a program code for executing a second shift of the display field in the vertical direction when the whole data to be displayed is not displayed in the display field although the first shift was executed.

The program code for shifting the display field may comprise a program code for executing a first shift of the display field in a horizontal direction so that a center of the data to be displayed is positioned approximately in a middle between a right end of the display field and a left end thereof, and a program code for executing a second shift of the display field in the horizontal direction when the whole data to be displayed is not displayed in the display field although the first shift was executed.

The data may be a waveform of a signal.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Hereinafter, an embodiment of the present invention will be explained in detail with reference to FIGS. 1 to 6.

FIGS. 1 to 6 are views showing an embodiment of the display controlling device according to the present invention.

First, the construction of a signal measurement system using the display controlling device will be explained.

Figure 1:
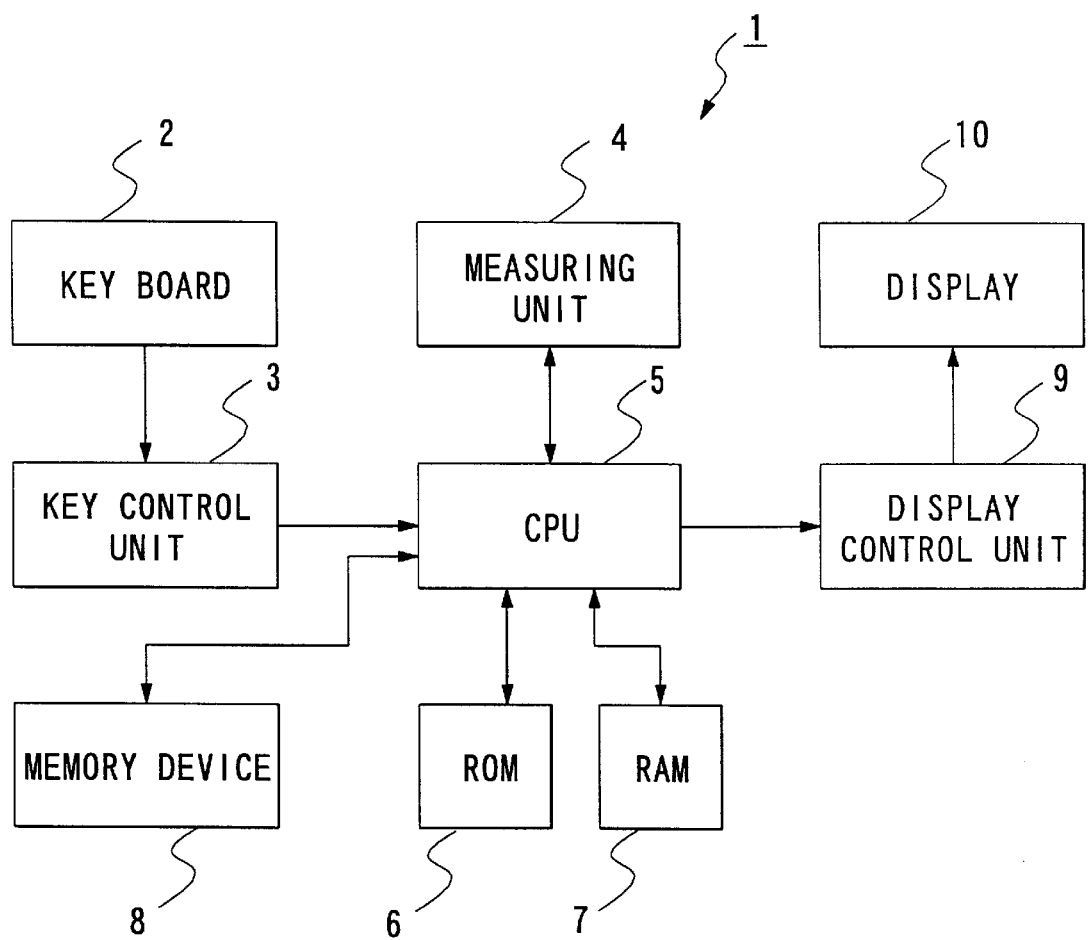
FIG. 1 is a block diagram showing a principal construction of a control system in a signal measurement system using a display controlling device according to the present invention.

FIG. 1 is a block diagram showing a principal construction of a control system in a signal measurement system using a display controlling device according to the present invention.

In FIG. 1, the signal measurement system 1 comprises a keyboard 2, a key control unit 3, a measuring unit 4, a CPU (Central Processing Unit) 5, a ROM (Read Only Memory) 6, a RAM (Random Access Memory) 7, a memory device 8, a display control unit 9 and a display 10.

The keyboard 2 comprises each type of command key, a numerical key (ten-key), a pointing device or the like. The keyboard 2 outputs each type of key-in signal according to a key operation carried out by a user and a displacement signal according to a pointing device operation, to the key control unit 3.

The key control unit 3 converts each type of key-in signal outputted from the keyboard 2 and the displacement signal outputted from the pointing device into a predetermined signal form to output the converted signals to the CPU 5 as each type of key-in information and a displacement information.

The measuring unit 4 measures a waveform of a signal generated by an external device, for example, that of an optical pulse. The measuring operations of the measuring unit 4 are controlled by a control signal related to the above measurement, which is outputted from the CPU 5. The measuring unit 4 measures a signal outputted from the external device to output the measured waveform data obtained by measuring the signal to the CPU 5.

The CPU 5 carries out the following control processes. The CPU 5 analyzes each type of key-in information outputted from the key control unit 3. The CPU 5 outputs a measurement control signal for controlling the measuring operations of the measuring unit 4 to the measuring unit 4 according to the control program f or each unit, which is stored in the ROM 6. The CPU 5 commands the memory device 8 to memorize the measured waveform data and to reproduce the memorized waveform data. When the CPU 5 carries out the control for displaying the measured waveform, the CPU 5 analyzes the cursor movement signal, the scroll command signal for scrolling the display field to display the specific waveform data and the key-in information, which are outputted from the key control unit 3. When the CPU 5 carries out the display controlling process (shown in FIG. 2), the display control signal is outputted to the display control unit 9 to update the on-screen-display data (the measured waveform data, each type of parameter to be displayed or the like), which is displayed on the display screen of the display 10 according to the display control program stored in the ROM 6. Thereby, the CPU 5 controls the update of the display screen for the measured waveform data.

The ROM 6 forms a program area for storing each type of control program, the display control program or the like, for carrying out the control processes by the CPU 5.

The RAM 7 forms a work memory area for memorizing the program for carrying out the control processes by the CPU 5 temporarily. The RAM 7 forms a display memory area for expanding the measured waveform data and the display field data, to update the measured waveform data displayed on the screen by moving the cursor.

The memory device 8 is composed of a hard disk device, a floppy disk device or the like. A write-in operation of the memory device 8 and a read-out operation thereof are controlled by the CPU 5 to use the memory device 8 for memorizing the measured waveform data and for reproducing the memorized waveform data.

The display control unit 9 converts the on-screen-display data (the measured waveform data, each type of parameter to be displayed or the like), which is outputted from the CPU 5, into data having a display signal form corresponding to an I/F (interface) part (which is not shown in the drawings) in the display 10. The display control unit 9 outputs the data having the display signal form to the display 10 to display the measured waveform data display screen.

Next, the operations of the signal measurement system using the display controlling device will be explained.

Figure 2:
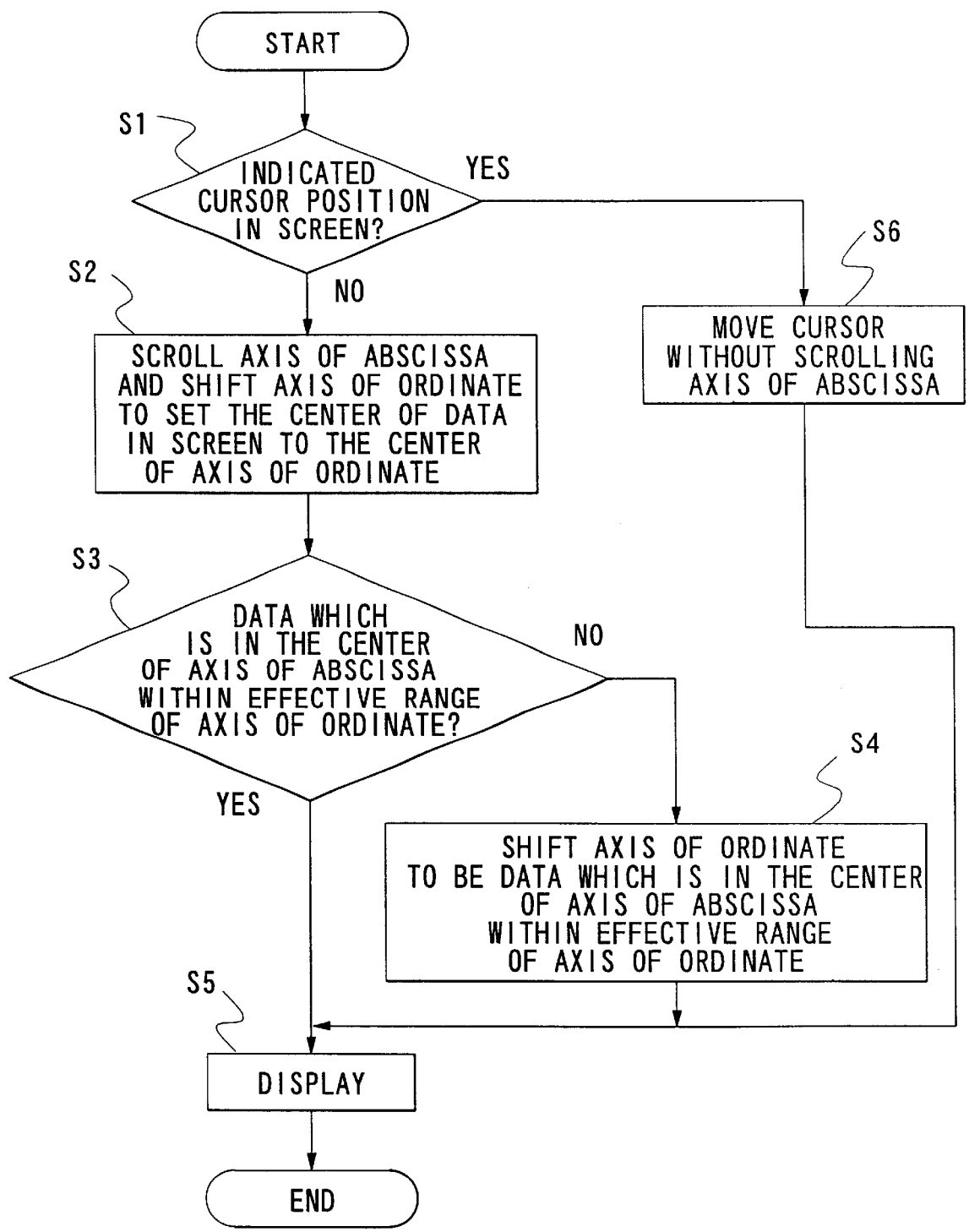
FIG. 2 is a flow chart showing a display controlling process which is carried out by a CPU in the signal measurement system shown in FIG. 1.

The display controlling process carried out by the CPU 5 provided in the signal measurement system 1 shown in FIG. 1 will be explained with reference to the flow chart shown in FIG. 2.

When the display controlling process is started by reading out the display control program from the ROM 6 to expand the program into the work memory area of the RAM 7, the measured waveform data, the display field data for displaying the specific measured waveform data on the screen and the cursor display data, which are read out from the memory device 8 are expanded into the display memory area of the RAM 7. The display control signal is outputted to the display control unit 9 according to the above expanded data. Thereby, the display field for displaying the measured waveform is displayed on the display screen of the display 10. Then, the measured waveform data to be displayed is displayed in the display field. In the step S1, the CPU 5 analyzes the cursor movement signal which is one of the key-in signals outputted from the key control unit 3 to judge whether the cursor position indicated by using the keyboard 2 is in the display field for displaying the measured waveform or out of the display field.

In the step S2, when the CPU 5 judges that the indicated cursor position is not in the display field for displaying the measured waveform but out of the display field, the CPU 5 scrolls the axis of abscissa of the display scale which is set on the basis of the display field expanded into the work memory area of the RAM 7. That is, the display field is scrolled in the horizontal direction by the CPU 5 when the indicated cursor position is not in the display field. The axis of ordinate of the display scale which is set on the basis of the display field is shifted so that the center of the specific measured waveform data to be examined, which is displayed in the display field (a central level of the waveform data corresponding to the cursor position) is set to the center of the axis of ordinate. That is, the display field is shifted in the vertical direction so that the center of the specific measured waveform data which is displayed in the display field is positioned approximately in a middle between an upper end of the display field and a lower end thereof. Accordingly, the measured waveform data, the display field data and the cursor display data, which are expanded into the display memory area of the RAM 7 are updated.

After the axis of abscissa was scrolled in the step S2, the CPU 5 judges whether the measured waveform data which is in the center of the axis of abscissa of the updated display field which is expanded into the display memory area of the RAM 7 (that is, the specific measured waveform data to be examined, which is positioned in the middle between a right end of the display field and a left end thereof by scrolling the display field) is within an effective range of the axis of ordinate of the display field (step S3). The effective range of the axis of ordinate of the display field means the range between the upper end of the display field in which the waveform data can be displayed and the lower end thereof.

That is, when the axis of abscissa is scrolled and the axis of ordinate is shifted so that the center of the measured waveform data is set to the center of the axis of ordinate, in case that the measured waveform is a monotone increasing waveform (the waveform which is simply raised to the right) or a monotone decreasing waveform (the waveform which is simply fallen to the right), the measured waveform data can be displayed in the display field. On the other hand, in case of the measured waveform data having a peak, there is some possibility that the peak of the measured waveform data is out of the upper end of the display field or out of the lower end thereof. For the above reason, in the step S3, it is judged whether the peak of the measured waveform is within the effective range of the axis of ordinate of the display field or not. In other word, it is judged whether the peak to be examined is displayed in the displayed field or not.

When the measured waveform data which is in the center of the axis of abscissa of the display field is within the effective range of the axis of ordinate of the display field by carrying out the process of the step S3, the CPU 5 outputs the display control signal to the display control unit 9 to update the display screen of the display 10 by using the measured waveform data and the display field data which are expanded into the display memory area of the RAM 7 in the step S2. In the step S5, the measured waveform data is displayed in the display field scrolled by moving the cursor so that the center of the measured waveform data is in the center position of the axis of abscissa of the display field and that of the axis of ordinate thereof. That is, the specific measured waveform data to be examined, which is positioned approximately in the middle between the right end of the display field and the left end thereof is displayed so that the center of the specific measured waveform data is positioned approximately in a middle between an upper end of the display field and a lower end thereof. Then, the display controlling process is finished.

When the measured waveform data which is in the center of the axis of abscissa of the display field is not within the effective range of the axis of ordinate of the display field by carrying out the process of the step S3, in the step S4, the CPU 5 updates the measured waveform data, the display field data and the cursor display data, which are expanded into the display memory area of the RAM 7, in order to adjust the amount of the shift of the axis of ordinate so that the peak of the measured waveform data which is in the center of the axis of abscissa is displayed within the effective range of the axis of ordinate of the display field. The CPU 5 outputs the display control signal to the display control unit 9 to update the display screen of the display 10 by using the measured waveform data, the display field data and the cursor display data, which are updated in the display memory area. In the step S5, the measured waveform data is displayed in the display field scrolled by moving the cursor so that the center of the measured waveform data is in the center position of the axis of abscissa of the display field and that of the axis of ordinate thereof. Then, the display controlling process is finished.

When it is judged that the cursor position indicated by using the keyboard 2 is in the display field in which the measured waveform is displayed in the step S1, in the step S6, the CPU 5 updates the measured waveform data, the display field data and the cursor display data, which are expanded into the display memory area of the RAM 7, so that only the cursor is moved to the position indicated by using the keyboard 2 without scrolling the axis of abscissa of the display field. The CPU 5 outputs the display control signal to the display control unit 9 to update the display screen of the display 10 by using the measured waveform data, the display field data and the cursor display data, which are updated in the display memory area. The measured waveform data is displayed in the display field scrolled by moving the cursor so that the center of the measured waveform data is in the center position of the axis of abscissa of the display field and that of the axis of ordinate thereof. Then, the display controlling process is finished.

The examples of the display screen of the display 10, on which the measured waveform data is displayed by carrying out the above display controlling process are shown in FIGS. 3 to 6.

Figure 3:
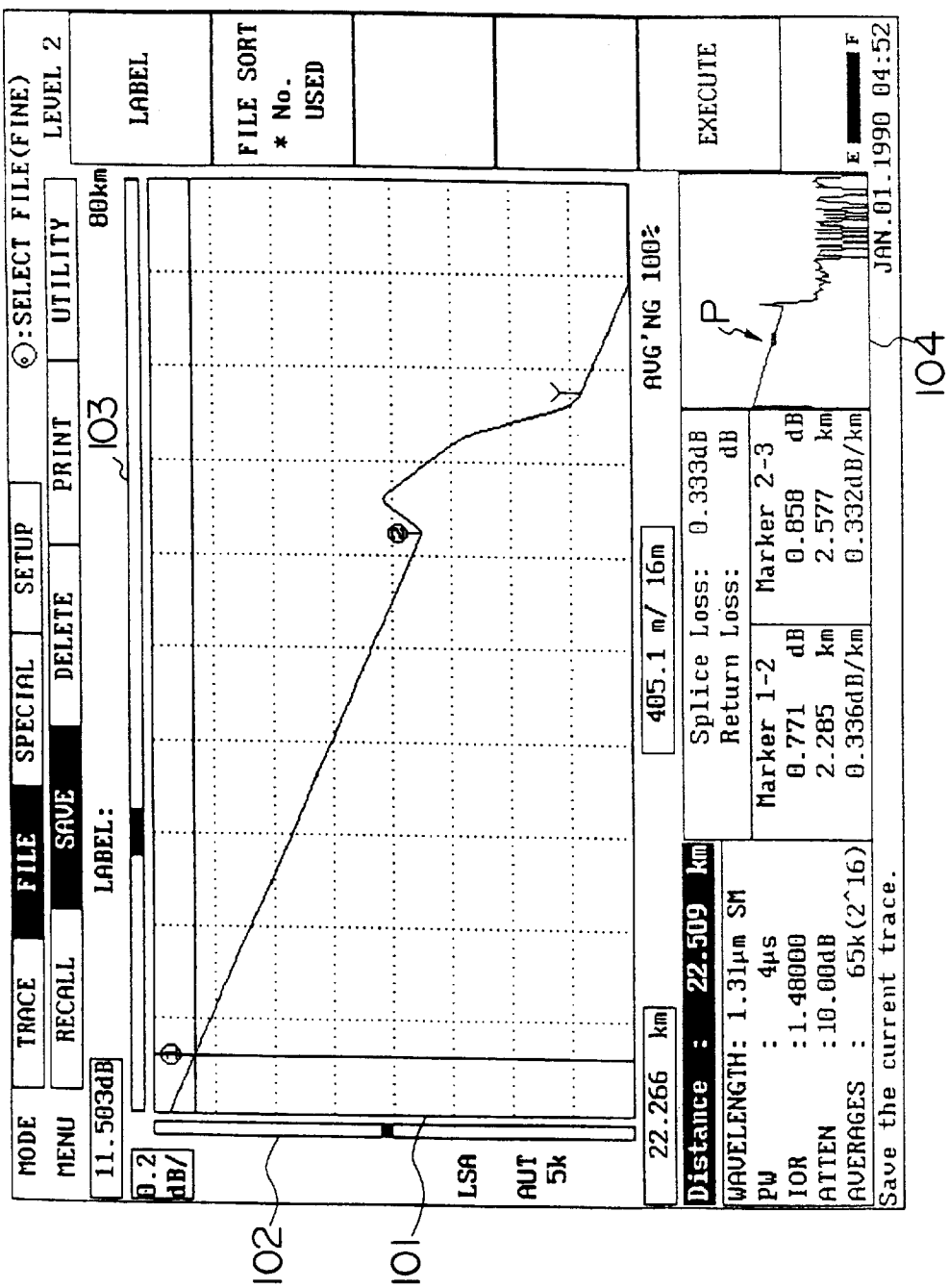
FIG. 3 is a view showing an initial state of a measured waveform display screen, which is displayed on a display screen of a display shown in FIG. 1.

FIG. 3 shows an initial state of the measured waveform display screen, which is displayed on the display screen of the display 10. In the display field 101, the measured waveform data is enlarged to display it by a predetermined magnification. The cursor position (the point at which the vertical solid line and the horizontal solid line cross) is in the display field 101. In FIG. 3, the reference numeral 102 denotes a scroll bar for showing the display range of the axis of ordinate of the display field 101, 103 denotes a scroll bar for showing the display range of the axis of abscissa of the display field 101, and 104 denotes an auxiliary display screen for displaying the whole measured waveform data. The reference P shown in the auxiliary display screen 104 denotes the cursor position.

Figure 4:
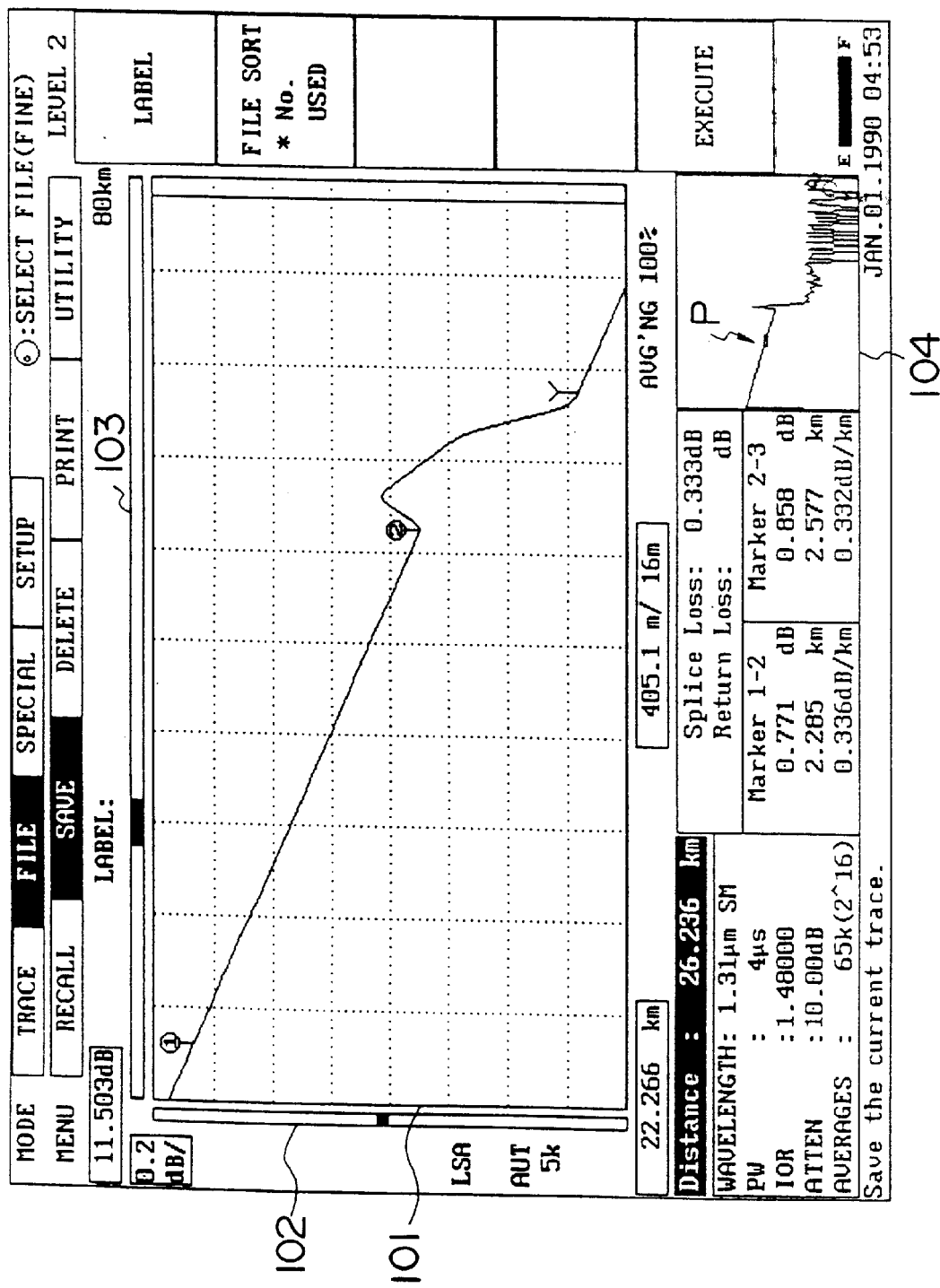
FIG. 4 is a view showing a measured waveform display screen when a cursor which is within a display field in the initial state shown in FIG. 3 is moved toward a right end portion of the display field within the display field.

When the cursor displayed in the display field 101 which is in the initial state shown in FIG. 3 is moved toward a right end portion within the display field 101 as shown in FIG. 4, only the cursor is moved to the indicated position and the display position of the measured waveform data is not changed by carrying out the display controlling process.

Figure 5:
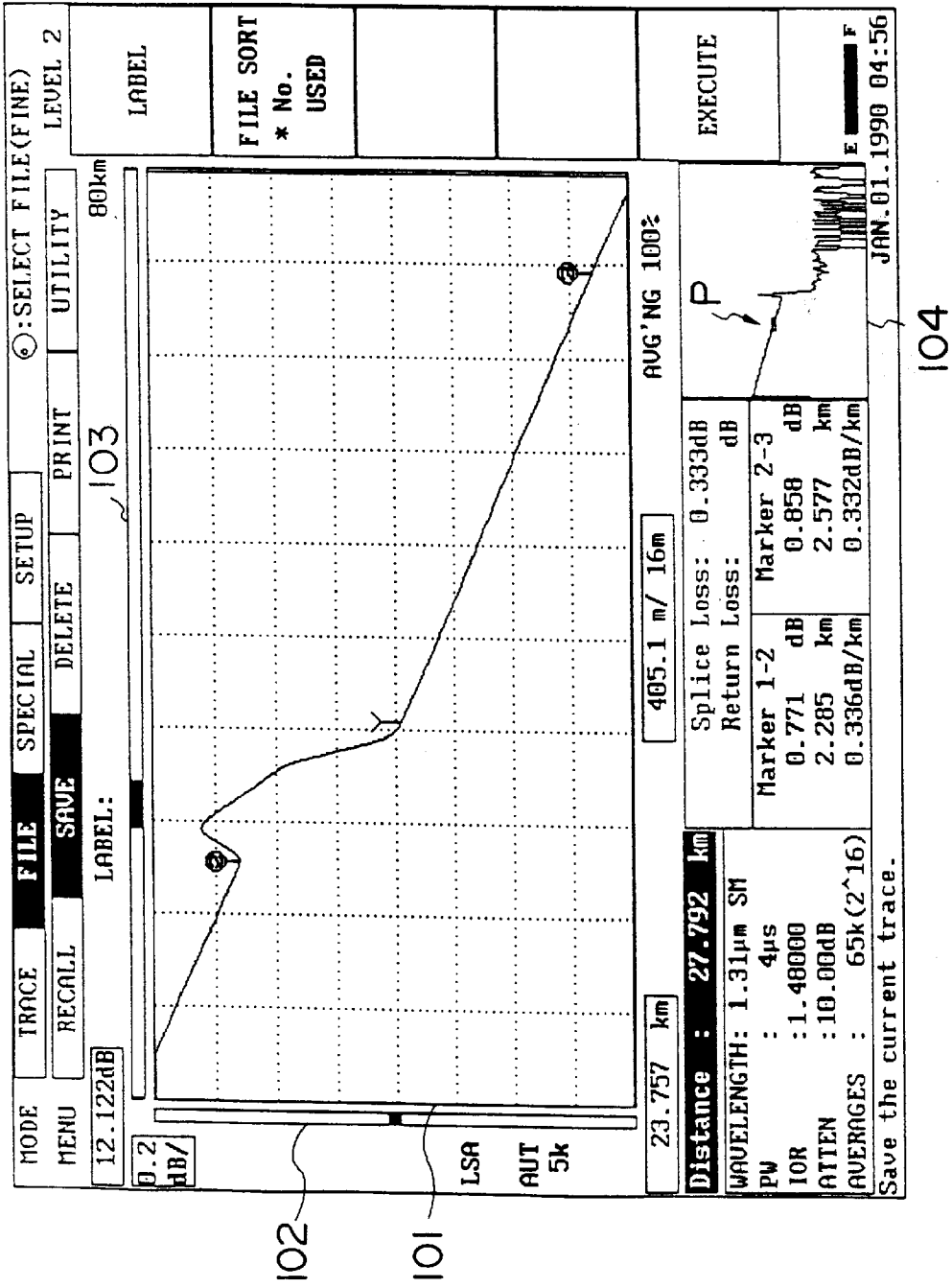
FIG. 5 is a view showing a measured waveform display screen when a cursor which is within a display field shown in FIG. 4 is further moved toward a right end portion of the display field.

When the cursor is further moved in the right direction from the cursor position shown in FIG. 4 to be the cursor out of the display field 101, the axis of abscissa is scrolled and the axis of ordinate is automatically shifted correspondingly to the center of the measured waveform data. As shown in FIG. 5, the measured waveform data which is displayed in the display field 101 is updated.

Figure 6:
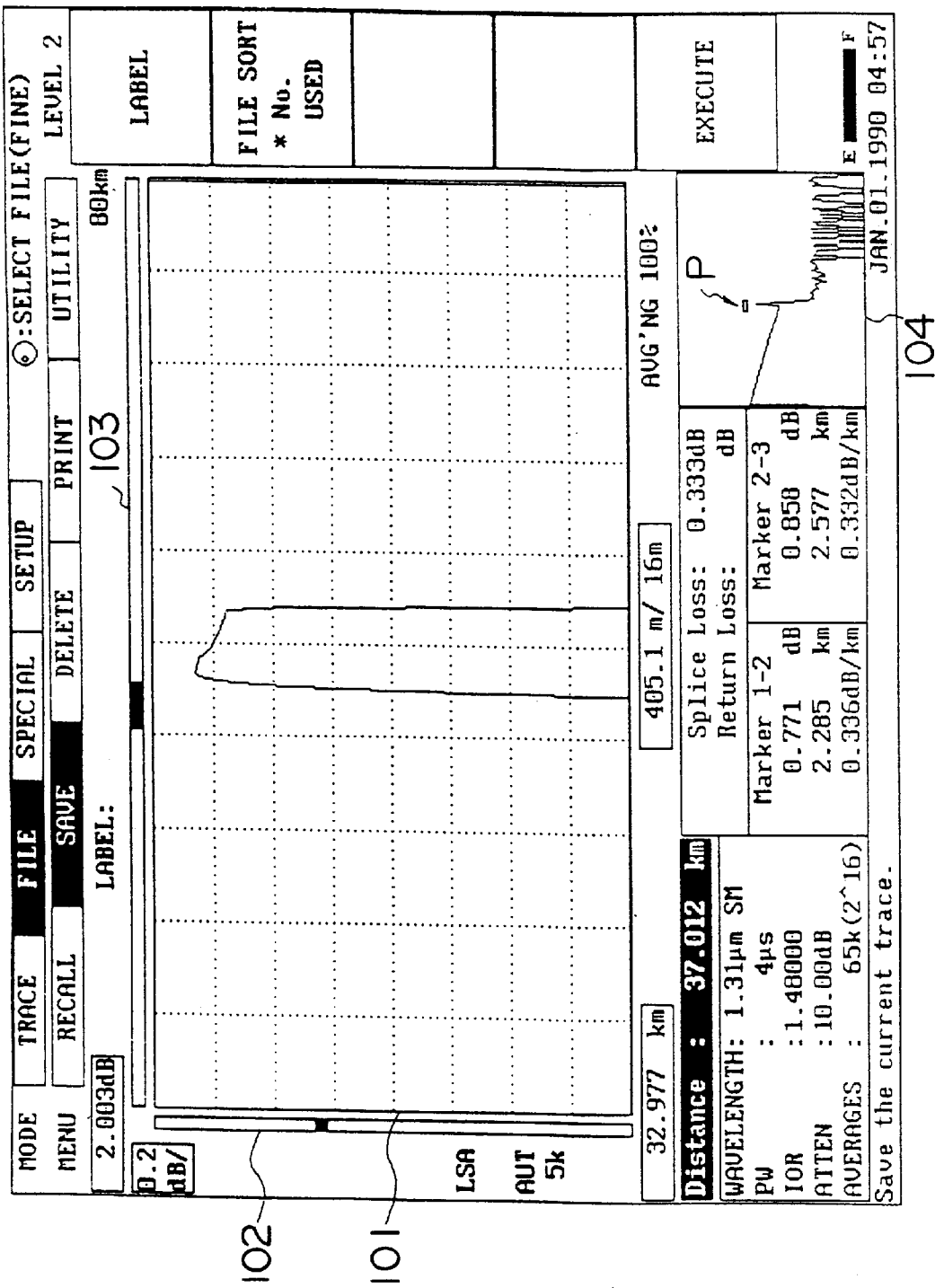
FIG. 6 is a view showing a state that a measured waveform including a peak is displayed in a display field by carrying out the display controlling process shown in FIG. 2.

When there is a sharp peak of the waveform, which projects in the upper direction, in the indicated position to which the cursor is moved from the cursor position shown in FIG. 3 in the right direction as shown in the auxiliary display screen 104 of FIG. 6, the peak is out of the upper end portion of the display field 101 by automatically shifting the axis of ordinate correspondingly to the center of the measured waveform data. As a result, the whole peak cannot be displayed. For this reason, the amount of shift of the axis of ordinate is automatically adjusted so that the peak of the measured waveform data is displayed within the effective range of the axis of ordinate of the display field by carrying out the above display controlling process. As shown in the display field 101 of FIG. 6, the peak is displayed in the position lowered by about ⅛ of the height of the display field 101 from the upper end of the display field 101.

Although it is explained that the peak of the measured waveform data shown in FIG. 6, which projects in the upper direction is displayed by adjusting the amount of shift of the axis of ordinate, the present invention is not limited to this. When the peak of the measured waveform data, which projects in the lower direction is displayed in the display field, the amount of shift of the axis of ordinate may be adjusted so that the peak is displayed in the position heightened by-about ⅛ of the height of the display field 101 from the lower end of the display field 101. Although the amount of shift of the axis of ordinate is adjusted so that the peak is displayed in the position lowered (or heightened) by about ⅛ of the height of the display field 101 from the upper (or lower) end of the display field 101, the present invention is not limited to the above amount of shift. The amount of shift may be optionally set if the peak is displayed within the effective range of the axis of ordinate of the display field 101 so that an observer (an examiner) can examine the peak easily.

As described above, in the signal measurement system 1 using the display controlling device according to the present invention, because the axis of abscissa and that of ordinate are automatically scrolled or shifted by moving the cursor in the display field 101 in which the measured waveform data is enlarged to display it, so that the measured waveform is displayed in the best position of the display field 101 correspondingly to the indicated cursor position, it is possible to easily carry out the operations for scrolling the display field by moving the cursor in order to examine the detail of the measured waveform by enlarging the measured waveform to display it.

As described above, it is explained that the display field is shifted in the vertical direction so that when the display field is scrolled in the horizontal direction to display the waveform data to be examined, the whole waveform data is displayed in the display field. The present invention is not limited to this. When the display field is scrolled in one direction (for example, the vertical direction, the diagonal direction or the like), the display field may be shifted in another direction which is not parallel to the one direction.

In particular, the display field may be shifted in the horizontal direction so that when the display field is scrolled in the vertical direction to display the specific waveform data to be examined, the whole specific waveform data is displayed in the display field.

Further, the shift step may be carried out by executing a first shift of the display field in a horizontal direction so that a center of the portion of the data is positioned approximately in a middle between a right end of the display field and a left end thereof, and by further executing a second shift of the display field in the horizontal direction when the whole portion of the data is not displayed in the display field although the first shift was executed. Thereby, the peak extending in the horizontal direction can be displayed in the display field, easily.

Because the display field for the waveform signal is automatically adjusted according to the indicated cursor position, it is possible to easily carry out the operations for scrolling the display field by moving the cursor in the screen on which the waveform signal is displayed.

Because the amount of shift of the display field is automatically adjusted according to the shape of the waveform signal, it is possible to easily carry out the operations, for example, the operations for examining the detail of the enlarged waveform signal to be displayed by moving the cursor.

The entire disclosure of Japanese Patent Application No. Tokugan-Hei 10-263592 filed on Sep. 17, 1998 including specification, claims drawings and summary are incorporated herein by reference in its entirety.

What is claimed is:

1. A display controlling device for controlling a display position of a waveform signal displayed on a screen of a display device according to a cursor position indicated by an input part, comprising:
   a judging circuit for judging whether the cursor position indicated by the input part is in the screen or out of the screen; and
   a display control circuit for scrolling a display field for displaying the waveform signal on the screen in one direction and for shifting the display field in another direction, according to the cursor position indicated by the input part, when the judging circuit judges that the indicated cursor position is out of the screen;
   wherein the display control circuit executes a first shift that the display field is shifted so that a center of the waveform signal is positioned approximately in a middle of the display field in the another direction, and further executes a second shift that the display field is shifted so that the waveform signal which is in a middle of the display field in the one direction is displayed on the screen when the waveform signal is not displayed on the screen although the first shift is executed.

2. The display controlling device as claimed in claim 1, wherein the one direction is a horizontal direction, and the another direction is a vertical direction.

3. The display controlling device as claimed in claim 2, wherein an amount of the second shift is automatically adjusted so that an upper end portion of the waveform signal is displayed in a position lowered by about $\frac{1}{8}$ of a height of the display field from an upper end of the display field when the upper end portion of the waveform signal is out of the upper end of the display field.

4. The display controlling device as claimed in claim 2, wherein an amount of the second shift is automatically adjusted so that a lower end portion of the waveform signal is displayed in a position heightened by about $\frac{1}{8}$ of a height of the display field from a lower end of the display field when the lower end portion of the waveform signal is out of the lower end of the display field.

5. A display controlling method for controlling a display position of a waveform signal displayed on a screen of a display device according to a cursor position indicated by an input part, comprising the steps of;
   judging whether the cursor position indicated by the input part is in the screen or out of the screen; and
   scrolling a display field for displaying the waveform signal on the screen in one direction and shifting the display field in another direction, according to the cursor position indicated by the input part, when it is judged that the indicated cursor position is out of the screen;
   wherein the shifting step is carried out by executing a first shift that the display field is shifted so that a center of the waveform signal is positioned approximately in a middle of the display field in the another direction, and further executing a second shift that the display field is shifted so that the waveform signal which is in a middle of the display field in the one direction is displayed on the screen when the waveform signal is not displayed on the screen although the first shift is executed.

6. The display controlling method as claimed in claim 5, wherein the one direction is a horizontal direction, and the another direction is a vertical direction.

7. The display controlling method as claimed in claim 6, wherein an amount of the second shift is automatically adjusted so that an upper end portion of the waveform signal is displayed in a position lowered by about $\frac{1}{8}$ of a height of the display field from an upper end of the display field when the upper end portion of the waveform signal is out of the upper end of the display field.

8. The display controlling method as claimed in claim 6, wherein an amount of the second shift is automatically adjusted so that a lower end portion of the waveform signal is displayed in a position heightened by about $\frac{1}{8}$ of a height of the display field from a lower end of the display field when the lower end portion of the waveform signal is out of the lower end of the display field.

9. A memory medium for storing a display control program for controlling a display position of a waveform signal displayed on a screen of a display device according to a cursor position indicated by an input part,
   wherein the display control program comprises:
       a program code for judging whether the cursor position indicated by the input part is in the screen or out of the screen; and
       a program code for scrolling a display field for displaying the waveform signal on the screen in one direction and for shifting the display field in another direction, according to the cursor position indicated by the input part, when it is judged that the indicated cursor position is out of the screen;

wherein the program code for shifting the display field comprises:

a program code for executing a first shift that the display field is shifted so that a center of the waveform signal is positioned approximately in a middle of the display field in the another direction; and a program code for further executing a second shift that the display field is shifted so that the waveform signal which is in a middle of the display field in the one direction is displayed on the screen when the wave form signal is not displayed on the screen although the first shift is executed.

10. The memory medium as claimed in claim 9, wherein the one direction is a horizontal direction, and the another direction is a vertical direction.

11. The memory medium as claimed in claim 10, wherein an amount of the second shift is automatically adjusted so that an upper end portion of the waveform signal is displayed in a position of the lowered by about ⅛ of a height of the display field from an upper end of the display field when the upper end portion of the waveform signal is out of the upper end of the display field.

12. The memory medium as claimed in claim 10, wherein an amount of the second shift is automatically adjusted so that a lower end portion of the waveform signal is displayed in a positioned heightened by about ⅛ of a height of the display field from a lower end of the display field when the lower end portion of the waveform signal is out of the lower end of the display field.

13. A display controlling device comprising:

a display for displaying a data to be displayed in a display field;

an input part for scrolling the display field; and a display field shift control unit for shifting the display field in one direction so that when the display field is scrolled in another direction to display the data to be displayed, the data to be displayed is displayed in the display field;

wherein the display field shift control unit executes a first shift that the display field is shifted so that a center of the data to be displayed is positioned approximately in a middle of the display field in the one direction, and further executes a second shift that the display field is shifted so that the data to be displayed, which is in a middle of the display field in the another direction is displayed in the display field when the data to be displayed is not displayed in the display field although the first shift is executed.

14. A display controlling device as claimed in claim 13, wherein the data is a waveform of a signal.

15. The display controlling device as claimed in claim 13, wherein the one direction is a vertical direction, and the another direction is a horizontal direction.

16. The display controlling device as claimed in claim 15, wherein an amount of the second shift is automatically adjusted so that the upper end portion of the data to be displayed is displayed in a position lowered by about ⅛ of a height of the display field from an upper end of the display field when the upper end portion of the data to be displayed is out of the upper end of the display field.

17. The display controlling device as claimed in claim 15, wherein an amount of the second shift is automatically adjusted so that a lower end portion of the data to be displayed is displayed in a position heightened by about ⅛ of a height of the display field from a lower end of the display field when the lower end portion of the data to be displayed is out of the lower end of the display field.

18. A display controlling method comprising the steps of:

displaying a data to be displayed in a display field;

scrolling the display field; and shifting the display field in one direction so that when the display field is scrolled in another direction to display the data to be displayed, the data to be displayed is displayed in the display field;

wherein the shifting step is carried out by executing a first shift that the display field is shifted so that a center of the data to be displayed is positioned approximately in a middle of the display field in the one direction, and further executing a second shift that the display field is shifted so that the data to be displayed, which is in a middle of the display field in the another direction is displayed in the display field when the data to be displayed is not displayed in the display field although the first shift is executed.

19. A display controlling method as claimed in claim 18, wherein the data is a waveform of a signal.

20. The display controlling method as claimed in claim 18, wherein the one direction is a vertical direction, and the another direction is a horizontal direction.

21. The display controlling method as claimed in claim 20, wherein an amount of the second shift is automatically adjusted so that an upper end portion of the data to be displayed is displayed in a position lowered by about ⅛ of a height of the display field from an upper end of the display field when the upper end portion of the data to be displayed is out of the upper end of the display field.

22. The display controlling method as claimed in claim 20, wherein an amount of the second shift is automatically adjusted so that a lower end portion of the data to be displayed is displayed in a position heightened by about ⅛ of a height of the display field from a lower end of the display field when the lower end portion of the data to be displayed is out of the lower end of the display field.

23. A memory medium for storing a display control program, wherein the display control program comprising:

a program code for displaying a data to be displayed in a display field;

a program code for scrolling the display field; and a program code for shifting the display field in one direction so that when the display field is scrolled in another direction to display the data to be displayed, the data to be displayed is displayed in the display field;

wherein the program code for shifting the display field comprises:

a program code for executing a first shift that the display field is shifted so that a center of the data to be displayed is positioned approximately in a middle of the display field in the one direction; and a program code for further executing a second shift that the display field is shifted so that the data to be displayed, which is in a middle of the display field in the another direction is displayed in the display field when the data to be displayed is not displayed in the display field although the first shift is executed.

24. A memory medium for storing a display control program as claimed in claim 23, wherein the data is a waveform of a signal.

25. The memory medium as claimed in claim 23, wherein the one direction is a vertical direction, and the another direction is a horizontal direction.

26. The memory medium as claimed in claim 25, wherein an amount of the second shift is automatically adjusted so that an upper end portion of the data to be displayed is displayed in a position lowered by about ⅛ of a height of the display field from an upper end of the display field when the upper end portion of the data to be displayed is out of the upper end of the display field.

27. The memory medium as claimed in claim 25, wherein an amount of the second shift is automatically adjusted so that a lower end portion of the data to be displayed is displayed in a position heightened by about ⅛ of a height of the display field from a lower end of the display field when the lower end portion of the data to be displayed is out of the lower end of the display field.

* * * * *